United States Patent
Wu

Patent Number: 5,510,574
Date of Patent: Apr. 23, 1996

[54] ELECTRIC SHIELDING METAL SHELL FOR A RECEPTACLE IN A COMPUTER NETWORK SYSTEM

[75] Inventor: Peter Wu, Taipei, Taiwan

[73] Assignee: Hsing Chau Industrial Co., Ltd., Taipei, Taiwan

[21] Appl. No.: 178,414

[22] Filed: Jan. 6, 1994

[51] Int. Cl.⁶ ............................................. H05K 9/00
[52] U.S. Cl. ............................ 174/35 GC; 174/35 R; 361/818
[58] Field of Search ............................ 174/35 R, 356, 174/35 GC, 36, 19, 65 R; 361/816, 818

[56] References Cited

U.S. PATENT DOCUMENTS

| | | | |
|---|---|---|---|
| 2,120,993 | 6/1938 | Selig | 247/43 |
| 2,490,596 | 3/1946 | Morris | 174/35 R |
| 2,750,210 | 6/1965 | Trogdon et al. | 285/77 |
| 3,183,297 | 5/1965 | Curtiss | 174/65 R |
| 4,293,151 | 10/1981 | Manzel | 174/65 R |
| 4,557,545 | 12/1985 | Ohtsuki et al. | 174/35 C X |
| 4,866,213 | 9/1989 | Lindsay | 174/35 GC |

Primary Examiner—Kristine L. Kincaid
Assistant Examiner—Christopher Horgan
Attorney, Agent, or Firm—Varndell Legal Group

[57] ABSTRACT

An electric shielding metal shell having two symmetrical rectangular-shaped metal casings connected together to hold a receptacle and an electric wire covered within a braided earthed robe, so that the braided earthed robe with the electric wire extends out of said metal casings through a wire hole in the metal casings. The metal casings each have a respective unitary, open loop-like binding strip extending around the wire hole in either direction that are connected to each other to hold the braided earthed tube and the electric wire. The tail of either binding strip is inserted into a locating hole on the opposite binding strip and the hook of either binding strip is received in one of a series of retaining holes on the opposite binding strip.

1 Claim, 4 Drawing Sheets

5,510,574

ELECTRIC SHIELDING METAL SHELL FOR A RECEPTACLE IN A COMPUTER NETWORK SYSTEM

BACKGROUND AND SUMMARY OF THE INVENTION

The present invention relates to an electric shielding metal shell for mounting on a receptacle in a computer network to hold down the electric wire and to effectively protect against outside noises.

The receptacles in a computer network system must be shielded against outside noises, so that the transmission quality can be maintained. Conventionally, an electric shielding metal shell is commonly used and fastened around a receptacle to protect it against the interference of outside noises. This electric shielding metal shell is generally comprised of two symmetrical casings connected together, having a front opening that receives the receptacle, and a rear wire hole that permits the electric wire of the receptacle and the braided earth tube, which covers around the electric wire, to pass out of the electric shielding metal shell. This structure of electric shielding metal shell cannot firmly hold down the braided earthed tube and the electric wire in position, and therefore the electric shielding effect of the electric shielding metal shell is affected.

The present invention has been accomplished to provide an electric shielding metal shell which eleminates the aforesaid problem. According to one aspect of the present invention, the electric shielding metal shell comprised of two symmetrical metal casings connected together to hold a receptacle having an electric wire covered within a braided earthed tube, for permitting the braided earthed tube with the electric wire to extend out of said metal casings through a wire hole thereon, wherein said metal casings comprise a respective unitary, open loop-like binding strip extended around the wire hole in either direction and connected to each other to hold down the braided earthed tube and the electric wire. According to another aspect of the present invention, the binding strip of either metal casing comprises a flat front end having a locating hole, an elongated tail having a series of retaining holes, an arched middle portion connected between the flat front end and the elongated tail and having a hook near the locating slot and a plurality of barbs on an inner side. The binding strips of the metal casings are fastened together by inserting the tail of the binding strip of one metal casing inserted into the locating hole of the binding strip of the other metal casing, and then fastening the binding strips around the braided earth tube so that the hook of the binding strip of one metal casing is reclined in a retaining hole of the binding strip of the other metal casing and so that the barbs of the binding strips of the metal casings pierce into the braided earthed tube.

As the electric wire and the braided earthed tube thereof are tightly fastened together by the binding strips of the metal casings, a satisfactory electric shielding effect is achieved. As the binding strip on either metal casing is unitary made through a punching process, the electric shielding effect is improved. Further, because a series of retaining holes are made on the binding strip of either metal casing, the hook on the binding strip of one metal casing can be fastened to either retaining hole on the binding strip of the other metal casing according to the diameter of the braided earthed tube to be fastened.

DETAILED DESCRIPTION OF THE PREFERRED EMBODIMENT

Figure 1:
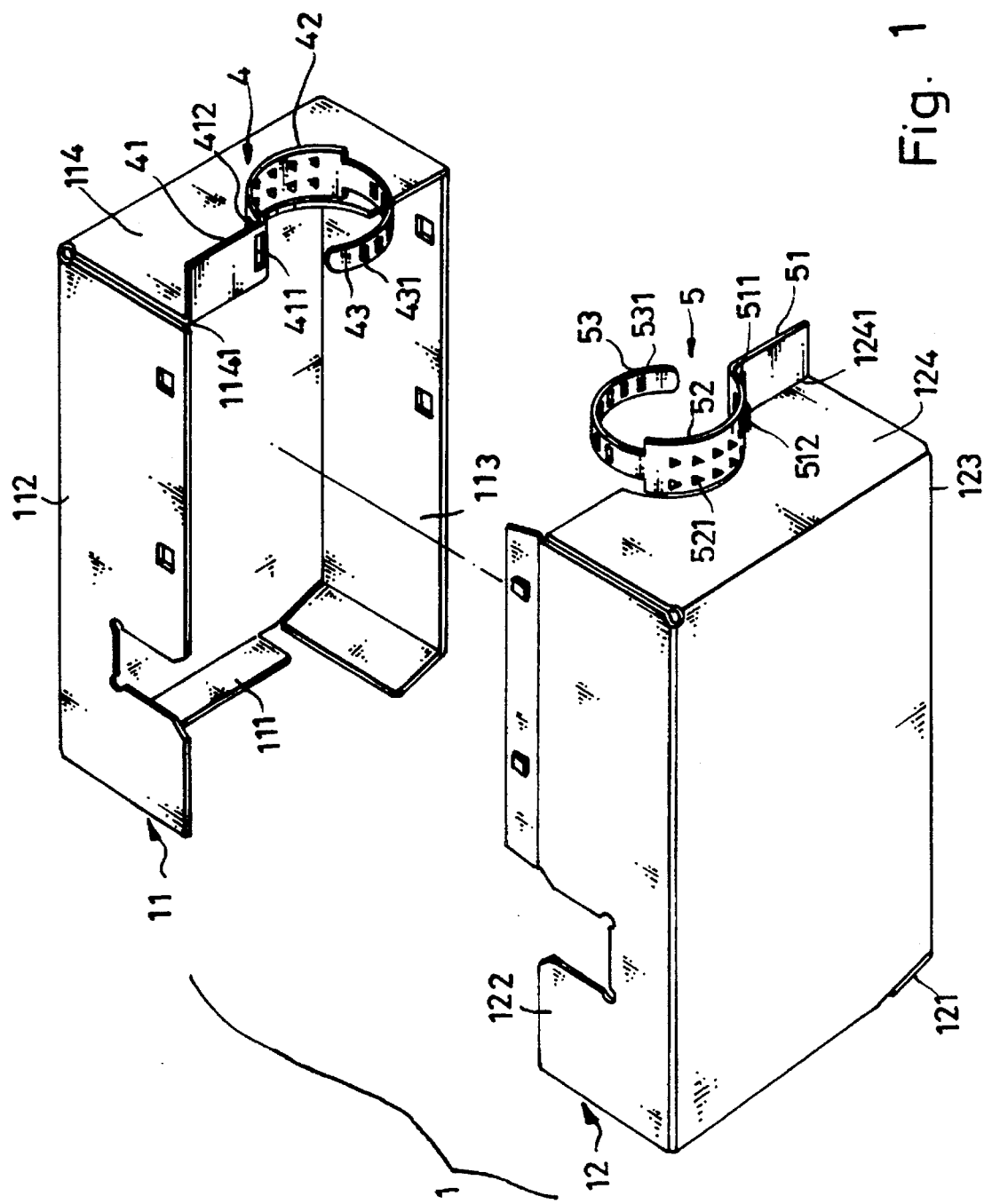
FIG. 1 is an exploded view of an electric shielding metal shell according to the preferred embodiment of the present invention.
Figure 2:
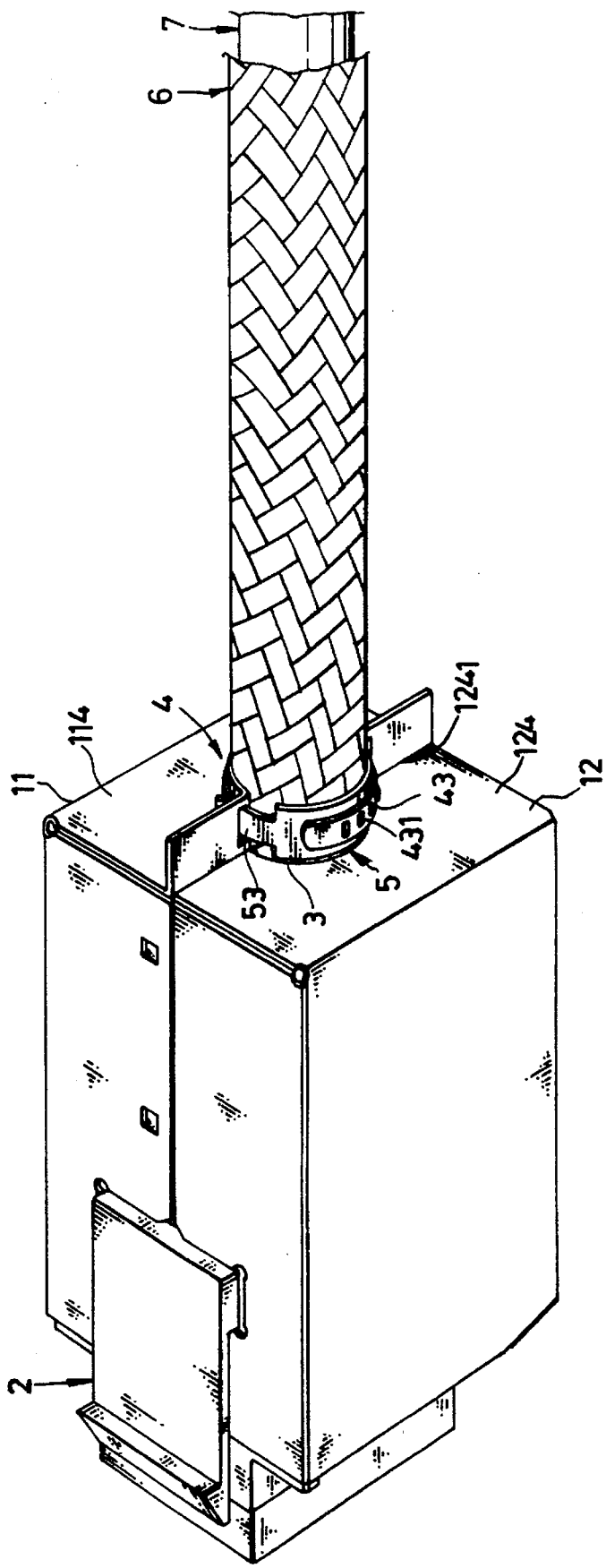
FIG. 2 shows the electric shielding metal shell of FIG. 1 mounted on a receptacle to hold down the electric wire.
Figure 3:
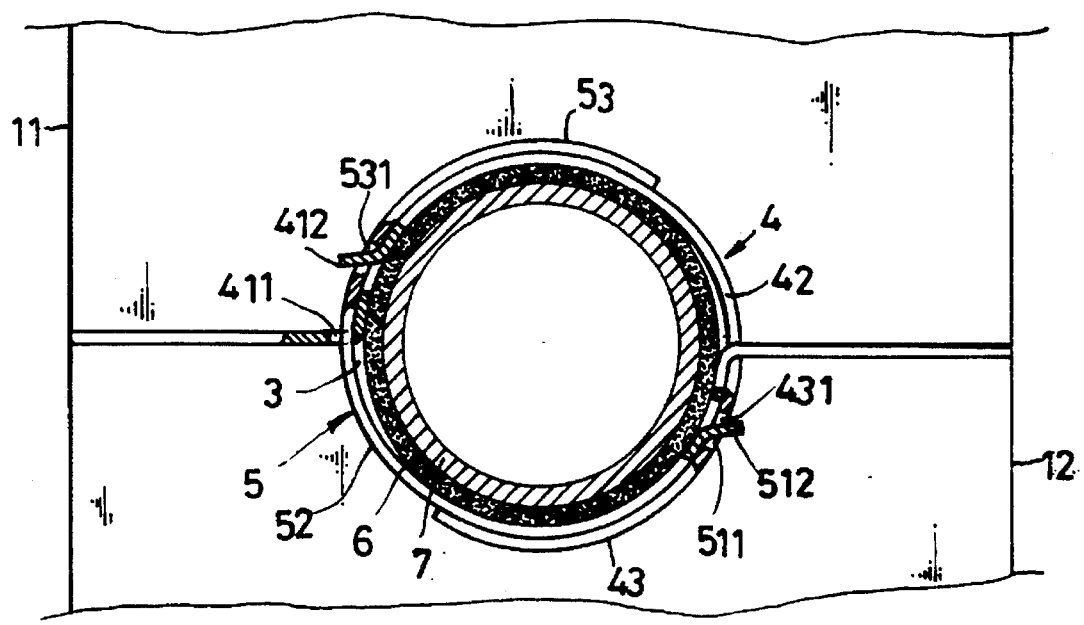
FIG. 3 is a cross section taken on FIG. 2 showing the electirc wire clamped between the upper and lower casings of the electric shielding metal shell by the unitary binding strips thereof.
Figure 4:
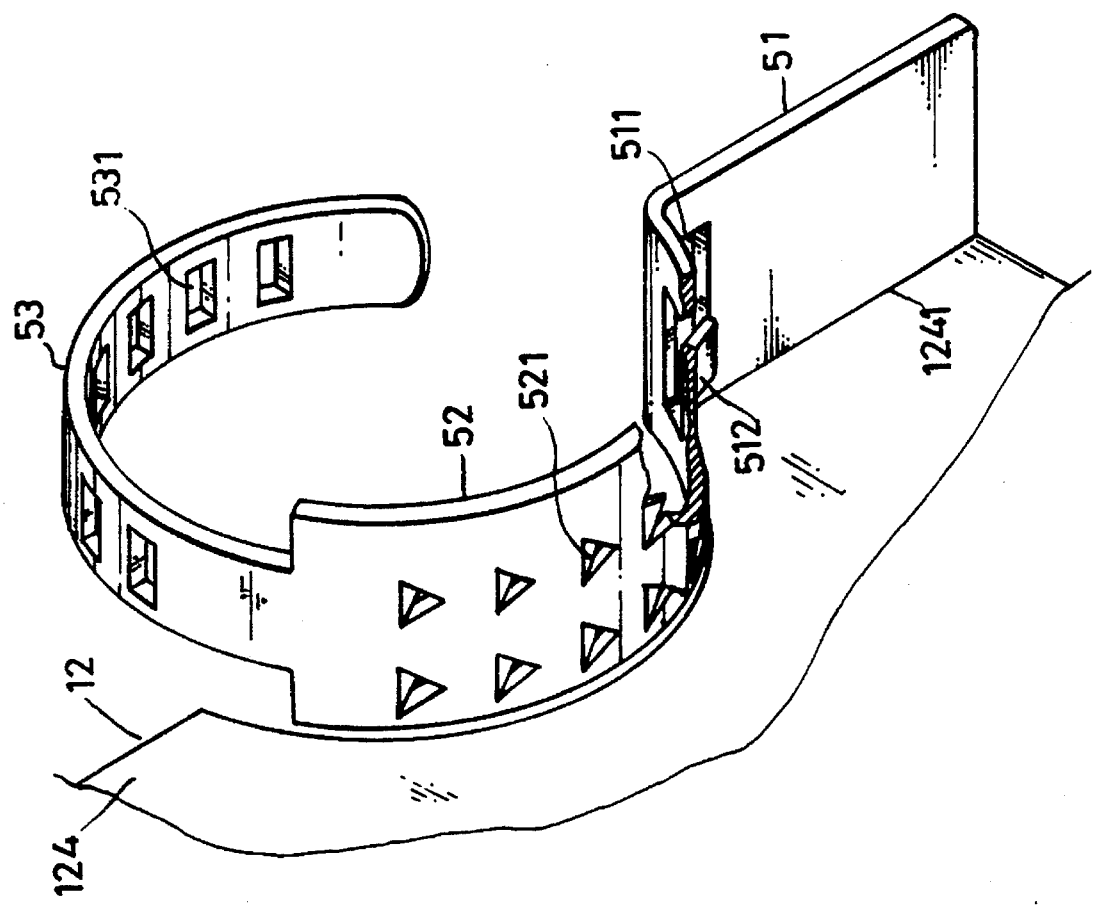
FIG. 4 is a perspective view in an enlarged scale of the binding strip on the lower casing of the electric shielding metal shell of FIG. 1.

Referring to FIGS. 1, 2, 3, and 4, an electric shielding metal shell or container 1 in accordance with the present invention is generally comprised of two symmetrical metal casings or half shells, namely, the upper casing 11 and the lower casing 12. The casing 11 or 12 is made of rectangular shape having four vertical walls, namely, the front wall 111 or 121, the rear wall 114 or 124, and two opposite side walls 112; 113 or 122; 123 raised around the four sides thereof. When the upper and lower casings 11; 12 are connected together, they form a container to hold a receptacle 2 between the front vertical walls 111; 121, a wire hole 3 is formed between the rear walls 114; 124 through which the electric wire 7 which is covered within a braided earthed tube 6 pass. Therefore, outside radiant rays are stopped from entering the receptacle 2, and inside electromagnetic waves are prohibited from escaping out of the electric shielding metal shell 1.

The rear wall 114 or 124 of the casing 11 or 12 comprises an extension wall 1141 or 1241 at right angles around the wire hole 3. The extension wall 1141 or 1241 is punched into a unitary, open loop-like binding strip 4 or 5 surrounding the wire hole 3. The binding strips 4; 5 on the upper and lower casings 11; 12 are made in reversed directions so that they can be fastened around the braided earthed tube 6 to hold down the electric wire 7. The binding strip 4 or 5 comprises a flat front end 41 or 51 having a locating hole 411 or 511, an elongated tail 43 or 53 having a series of retaining holes 431 or 531, an arched middle portion 42 or 52 connected between the flat front end 41 or 51 and the elongated tail 43 or 53 and having a hook 412 or 512 near the locating slot 411 or 511 and a plurality of barbs 421 or 521 on an inner side.

Referring to FIGS. 2 and 3 again, when the upper and lower casings 11; 12 are connected together to hold the receptable 2, the tail 43 or 53 of either binding strip 4 or 5 is respectively inserted into the locating hole 511 or 411 of the opposite binding strip 5 or 4 and fastened around the braided earthed tube 6 for permitting the hook 412 or 512 of either binding strip 4 or 5 to hook on either retaining hole 531 or 431 of the opposite binding strip 5, and therefore the barbs 421; 521 respectively pierce into the braided earthed tube 6 to hold it in place.

I claim:

1. An electric shielding metal shell comprising first and second symmetrical and rectangular-shaped metal half shells connected together to form a container for holding a receptacle and an electric wire covered with a braided earthed tube, said first half shell having a first hole and a first binding strip arranged around said first hole, said second half shell having a second hole and a second binding strip arranged around said second hole, said electric wire extending out of said container through said holes and held in place by said first and second binding strips, said first and second binding strips respectively having a flat front end with a locating hole, an elongated tail with a series of retaining holes, and an arched middle portion arranged between said flat front end and said elongated tail; said arched middle portions respectively having a locating slot, a hook and a plurality of barbs on an inner side thereof, wherein said first and second binding strips are fastened together by inserting said elongated tail of said first binding strip into said locating hole of said second binding strip and by inserting said elongated tail of said second binding strip into said locating hole of said first binding strip, so that said hook of said first binding strip is received in one of said plurality of retaining holes of said second binding strip, said hook of said second binding strip is received in one of said plurality of retaining holes of said first binding strip, and said barbs of said first and second binding strips pierce said braided earthed tube.

* * * * *